(12) United States Patent
Chandler et al.

(10) Patent No.: US 9,176,197 B2
(45) Date of Patent: Nov. 3, 2015

(54) BATTERY SENSING CIRCUIT PATH RESISTANCE COMPENSATION SYSTEMS AND METHODS

(71) Applicant: GM GLOBAL TECHNOLOGY OPERATIONS LLC, Detroit, MI (US)

(72) Inventors: Andrew K. Chandler, Plymouth, MI (US); Roger M. Brisbane, Washington, MI (US); Paul W. Kelley, Lake Orion, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 315 days.

(21) Appl. No.: 13/947,845

(22) Filed: Jul. 22, 2013

(65) Prior Publication Data

US 2015/0022213 A1 Jan. 22, 2015

(51) Int. Cl.
*G01R 31/36* (2006.01)
*H02J 7/00* (2006.01)

(52) U.S. Cl.
CPC ........ *G01R 31/3627* (2013.01); *G01R 31/3675* (2013.01); *H02J 7/007* (2013.01); *G01R 31/3648* (2013.01)

(58) Field of Classification Search
CPC .. G01R 31/3627; G01R 31/3648; H02J 7/007
USPC .................................. 324/426; 320/116, 118
See application file for complete search history.

(56) References Cited

U.S. PATENT DOCUMENTS

| | | | | |
|---|---|---|---|---|
| 7,246,004 | B2* | 7/2007 | Dudek et al. | 701/103 |
| 7,932,700 | B2* | 4/2011 | Cintra et al. | 320/135 |
| 8,612,733 | B2* | 12/2013 | Flippin | 713/1 |
| 8,902,072 | B2* | 12/2014 | Lee et al. | 340/636.1 |
| 8,922,165 | B2* | 12/2014 | Bills | 320/118 |
| 2011/0172940 | A1* | 7/2011 | Wood et al. | 702/63 |
| 2012/0119745 | A1* | 5/2012 | Deveau et al. | 324/429 |
| 2014/0306662 | A1* | 10/2014 | Kim et al. | 320/118 |

* cited by examiner

*Primary Examiner* — M'Baye Diao
(74) *Attorney, Agent, or Firm* — Phillips Ryther & Winchester; John P. Davis

(57) ABSTRACT

System and methods for measuring parameters of a battery system using a battery sensing circuit are presented. In certain embodiments, the systems and methods allow a vehicle battery sensing circuit and/or other associated system to measure a compensation parameter. The compensation parameter may be utilized by the battery sensing circuit and/or other associated system in measuring other parameters relating to the battery system including cell voltages.

19 Claims, 6 Drawing Sheets

BATTERY SENSING CIRCUIT PATH RESISTANCE COMPENSATION SYSTEMS AND METHODS

TECHNICAL FIELD

This disclosure relates to systems and methods for measuring parameters of a battery system using a battery sensing circuit. More specifically, but not exclusively, this disclosure relates to systems and methods for compensating for battery sensing circuit path resistance in measuring parameters of a battery system using a battery sensing circuit.

BACKGROUND

Passenger vehicles often include electric batteries for operating a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system may be used to power electric drivetrain components of the vehicle (e.g., electric drive motors and the like).

A battery system may be associated with a battery sensing circuit. The battery sensing circuit may be configured to perform one or more measurements relating to the battery system and/or report a state of the battery system. In certain circumstances, sensing paths between the battery sensing circuit and the battery system may have variable resistances. These variable resistances may decrease the accuracy of measurements performed by the battery sensing circuit which, in turn, may adversely affect battery system performance.

SUMMARY

Systems and methods are presented for measuring parameters of a battery system using a battery sensing circuit. More specifically, certain embodiments disclosed herein allow for accurate measurement of battery system parameters (e.g., cell voltages) by compensating for battery sensing circuit paths resistances. As used herein, a battery sensing circuit may be included as part of a battery sensing and/or control system. The battery sensing circuit may monitor a battery system and/or individual constituent battery cells (e.g., battery cells arranged in a stack).

In certain circumstances, input resistances along sensing lines between a battery sensing circuit and a battery cell can vary with temperature and/or time. Moreover, certain battery systems may include sensing circuit protection associated with sensing paths (e.g., fuses disposed in series with sensing lines) that may have variable resistances. Particularly, such variable resistances may be exhibited by designs incorporating large protective fuses. Variable resistances along sensing paths may decrease the accuracy of battery system parameter measurements performed by the battery sensing circuit including, for example, cell voltage measurements. Consistent with embodiments disclosed herein, one or more compensation parameters accounting for variable sensing path resistances may be determined and utilized in connection with battery system parameter measurements to ensure accuracy.

In certain embodiments, a system implementing embodiments disclosed herein may include a battery stack having a plurality of cells. A first balancing switch may be coupled in parallel with a first cell of the plurality of cells. A battery sensing circuit may be coupled to the first cell along a first sense path. Among other things, the battery sensing circuit may be configured to measure one or more voltages associated with the plurality of cells, determine a compensation parameter based in part on one or more measured voltages, and measure one or more actual voltages utilizing the determined compensation parameter.

In certain embodiments, the battery sensing circuit may be configured to measure a first voltage of the first cell with the first balancing switch and a second balancing switch associated with a second cell included in the battery stack turned off. In some embodiments, the second cell may be adjacent to the first cell in the battery stack. The battery sensing circuit may further measure a second voltage of the first cell with the first and second balancing switches turned on. A compensation parameter may be determined by the battery sensing circuit based on the measured first and second voltages. Utilizing the compensation parameter and at least one of the first and second voltages, an actual voltage of the first cell may be determined.

In further embodiments, a method for measuring an actual voltage of a first cell included in a battery stack may include measuring a first voltage of the first cell with a first balancing switch associated with the first cell turned off and a second balancing switch associated with a second cell included in the battery stack turned off. In some embodiments, the second cell may be adjacent to the first cell in the battery stack. The method may further include measuring a second voltage of the first cell with the first and second balancing switches turned on.

Based on the measured first and second voltages and one or more known currents, a compensation parameter may be determined. Utilizing the compensation parameter, at least one of the first and second voltages, and/or one or more known currents, an actual voltage of the first cell may be determined.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Figure 1:
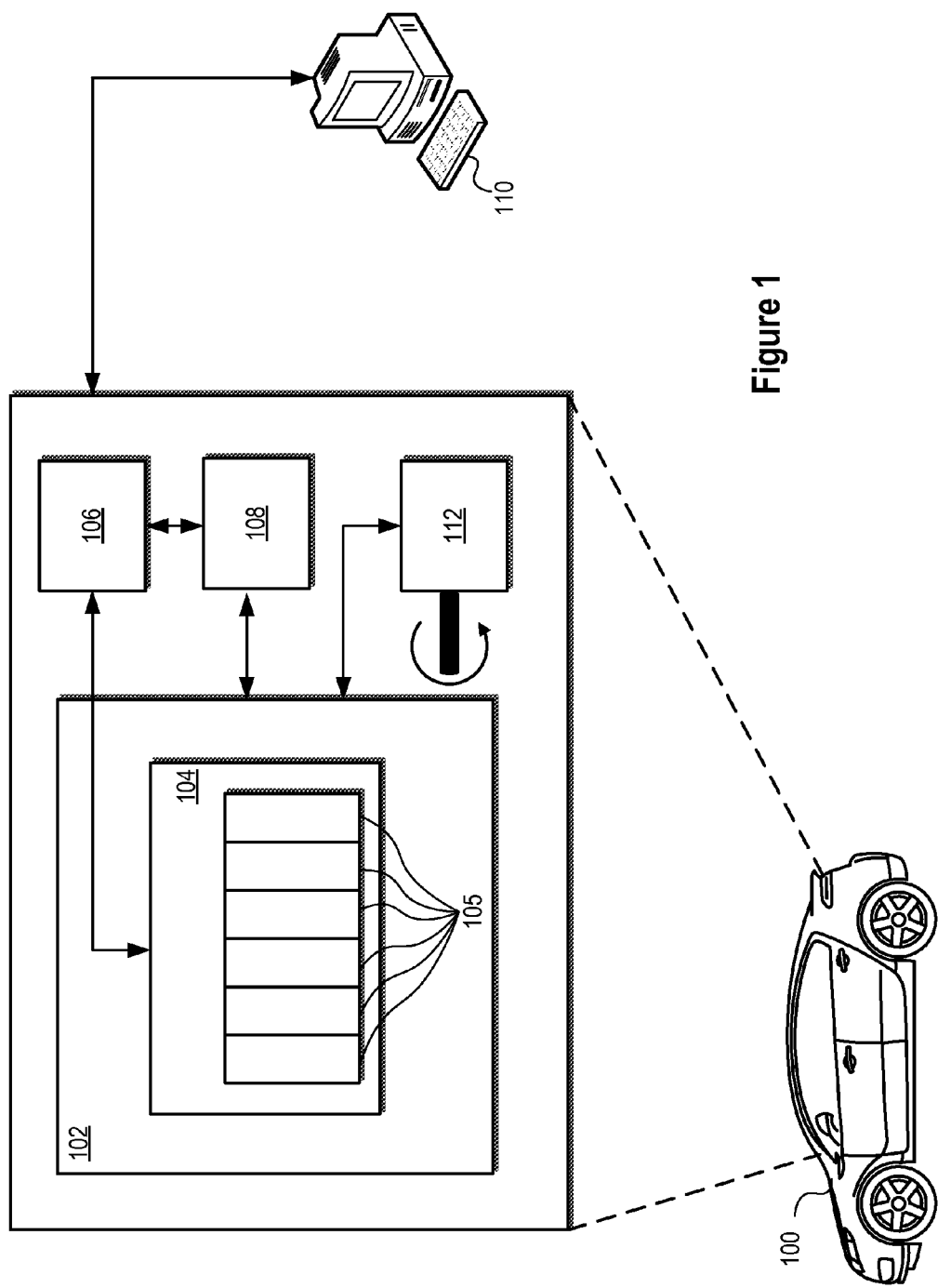
FIG. 1 illustrates a functional block diagram of an exemplary system for measuring operating parameters of a battery system in a vehicle consistent with embodiments disclosed herein.

FIG. 1 illustrates a functional block diagram of an exemplary system for measuring operating parameters of a battery system 102 in a vehicle 100 consistent with embodiments disclosed herein. The vehicle 100 may be a motor vehicle, a marine vehicle, an aircraft, and/or any other type of vehicle, and may include any suitable type of drivetrain for incorporating the systems and methods disclosed herein. While described herein in connection with a vehicle 100, the systems and methods disclosed herein may be used in connection a variety of other systems including, for example, battery systems associated with stationary power sources (e.g., generators) and/or the like.

As illustrated, vehicle 100 may include a battery system 102 configured to provide electrical power to certain components of the vehicle 100. For example, battery system 102 may be configured to provide power to electric drivetrain components 112 of the vehicle 100. The battery system 102 may include a single battery cell 105 or multiple battery cells 105 arranged in a battery cell stack 104.

As illustrated, the battery system 102 may be configured to directly provide power to electric drivetrain components 112. In certain embodiments, the battery system 102 may be configured to provide power to one or more other systems (not shown) including low voltage battery systems (e.g., lead-acid 12V automotive batteries) that supply electric energy to a variety of vehicle 100 systems including, for example, vehicle starter systems (e.g., a starter motor), lighting systems, audio systems, and/or the like.

In certain embodiments a battery sensing circuit 106 may be communicatively coupled to one or more battery cells 105 included in the battery cell stack 104. The battery sensing circuit 106 may comprise any suitable number of battery sensing circuits, voltage measurement circuits, switches, resistors, fuses, and/or any other electrical component and/or system in any suitable configuration for performing the methods disclosed herein. For example, in some embodiments, the battery sensing circuit 106 may, among other things, measure battery cell voltages, determine compensation parameters for measuring battery cell parameters, circulate electrical power to various components and systems in connection with battery sensing operations, and/or the like. In certain embodiments, the battery sensing circuit 106 may monitor certain parameters of a battery system 102 and/or report a status relating to the battery system 102. Parameters monitored by the battery sensing circuit 106 may include, without limitation, battery voltage, temperature, current, charge state, and/or any other relevant parameters pertaining to the individual battery cells 105 and/or battery stack 104.

The battery system 102 and/or battery sensing circuit 106 may be communicatively coupled with an associated battery control system 108. The battery control system 108 may be configured to monitor and control certain operations of the battery system 102, the battery sensing circuit 106, and/or other associated systems. For example, the battery control system 108 may be configured to monitor and control operations of the battery stack 104 and/or its constituent battery cells 105. Further, the battery control system 108 may be configured to monitor and/or control certain measurement and or compensation parameter determination operations performed by the battery sensing circuit 106. In some embodiments, the battery control system 108 may be configured to monitor and/or control the operation of one or more balancing switches incorporated in the battery sensing circuit 106. In further embodiments, an internal vehicle computer system (not shown) and/or any other suitable external computer system 110 may be configured to monitor and control certain operations of the battery system 102, the battery control system 108, and/or the battery sensing circuit 106.

In certain embodiments, the battery control system 108 and/or the battery sensing circuit 106 may be communicatively coupled with one or more sensors associated with the battery system 102 and/or its constituent cells 105 including, for example, voltage measurement circuits, temperature sensors, current sensors, and/or any other suitable sensor or sensors that may provide information utilized in the systems and methods disclosed herein. For example, in some embodiments, one or more sensors associated with the battery system 102 and/or its constituent cells 105 may provide information used in measuring one or more voltages of battery cells 105.

Certain embodiments disclosed herein may allow the battery control system 108 and/or the battery sensing circuit 106 to, among other things, determine one or more compensation parameters relating to sensing paths between the battery sensing circuit 106 and/or one or more battery cells 105 of battery system 102. The compensation parameters may account for variable resistances along sensing lines coupling the battery sensing circuit 106 to the battery system 102 and/or its constituent cells 105. In certain embodiments, the compensation parameters may be utilized in performing one or more battery system parameter measurements. For example, the compensation parameters may be utilized by the battery control system 108 and/or the battery sensing circuit 106 in performing voltage measurements relating to the battery system 102 and/or its constituent cells 105. In certain embodiments, utilizing the compensation parameters in performing voltage measurements may allow for more accurate voltage measurements accounting for variable resistances along sensing lines coupling the battery sensing circuit 106 to the battery system 102 and/or its constituent cells 105.

Figure 2:
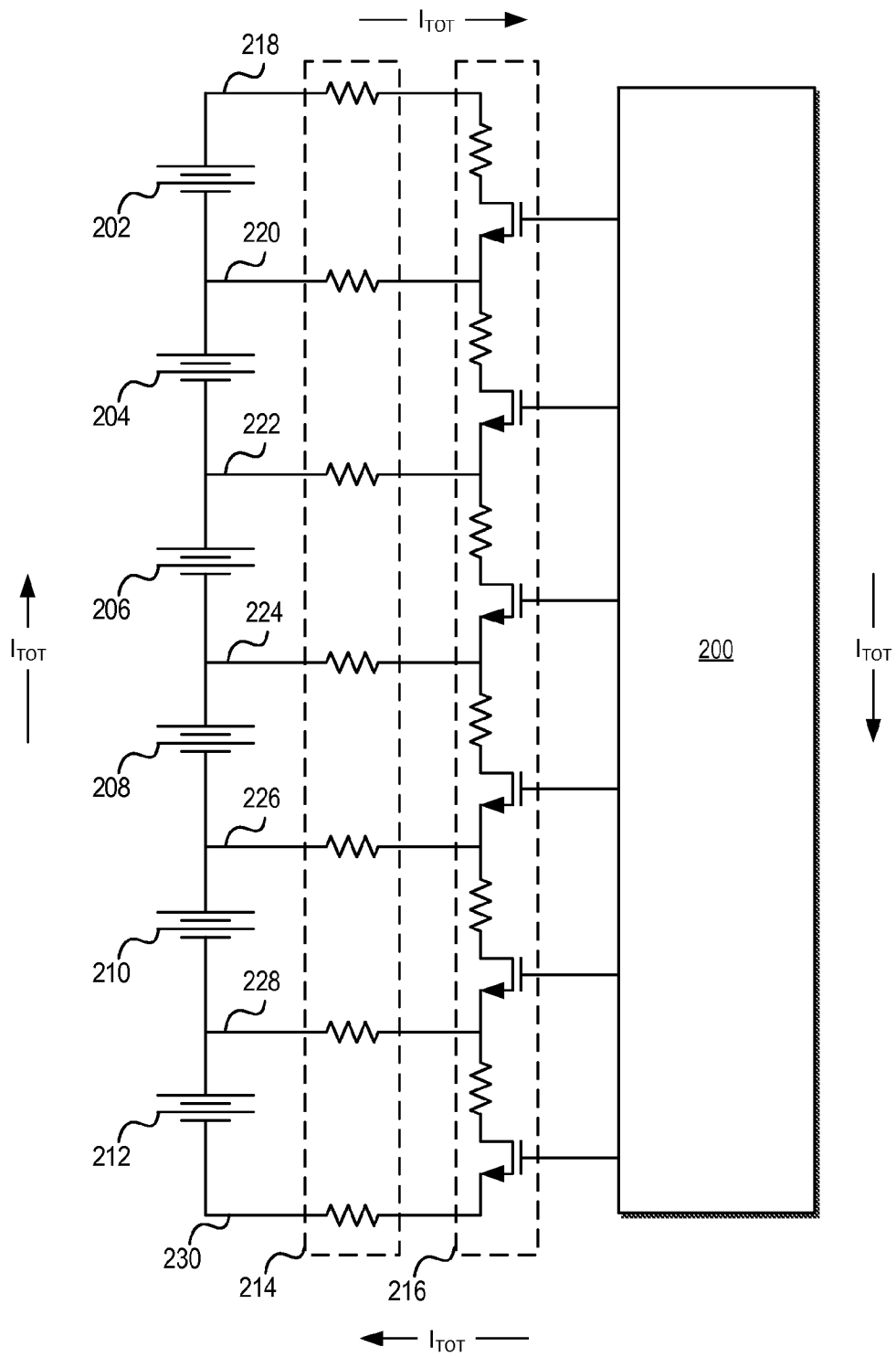
FIG. 2 illustrates a circuit diagram of an exemplary battery sensing circuit consistent with embodiments disclosed herein.

FIG. 2 illustrates a circuit diagram of an exemplary battery sensing circuit 200 consistent with embodiments disclosed herein. The battery sensing circuit 200 may be coupled to one or more battery cells 202-212 via one or more sensing lines 218-230. Although illustrated as including three battery cells 202-212, embodiments of the systems and methods disclosed herein may be utilized in connection with a battery system having any suitable number of battery cells.

The battery sensing circuit 200 may include one or more voltage measurement circuits (not shown) respectively coupled to the battery cells 202-212 via sensing lines 218-230. The voltage measurement circuits may be configured to measure a voltage of one or more of battery cells 202-212. The battery sensing circuit 200 may further include one or more current sensors (not shown) respectively coupled to the battery cells 202-212 via sensing lines 218-230 configured to measure a current flowing through one or more paths associated with one or more of battery cells 202-212. In certain embodiments, the sensing lines 218-230 may include one or more protective fuses (not shown) disposed in series therewith. In some embodiments, the protective fuses may protect the battery sensing circuit 200 and/or the one or more battery cells 202-212 from damage (e.g., via a fuse blow) in the event a leakage current exceeds certain protective thresholds.

The battery sensing circuit 200 and/or a control system including the battery sensing circuit 200 may include a cell balancing system 216. The cell balancing system 216 may, among other things, facilitate the selective energy transfer to, from, and/or between one or more battery cells 202-212 based on one or more control signals. In certain embodiments, the one or more control signals may be provided to the cell balancing system 216 by the battery sensing circuit 200 and/ or an associated control system. The cell balancing system 216 may include a number of sensors, resistors, switches, and/or any other electrical component and/or system in any suitable configured for facilitating selective energy transfer to, from, and/or between one or more battery cells 202-212.

A plurality of series resistances may exist on sensing paths between the cell balancing system 216 and/or an associated control system and the one or more battery cells 202-212. In certain embodiments, the resistances may be associated with sensing lines 218-230 and/or other components associated therewith (e.g., components disposed in a sensing path). Resistance along the sensing lines 218-230 and/or paths may be attributed to a variety of resistive sources and/or associated components. For example, one or more protective fuses included in a sensing path may introduce resistance along the sensing path. Series resistances associated with the sensing path between the cell balancing system 216 and/or an associated control system are represented in FIG. 2 by resistors 214. Moreover, a current flowing through battery cells 202-212 (e.g., a predetermined or measured current), that may be associated with a measurement power current of battery sensing circuit 216 is illustrated in FIG. 2 as $I_{TOT}$.

In certain embodiments, resistances associated with sensing paths between battery cells 202-212 and the battery sensing circuit 216 and/or an associated control system may vary. For example, sensing paths associated with battery cells 202, 212 and including sensing lines 218, 230 may have higher associated resistances than other sensing paths. These variable resistances may decrease the accuracy of measurements (e.g., voltage measurements) performed by the battery sensing circuit 216 and/or an associated system which, in turn, may adversely affect battery system performance. For example, voltages measured by battery sensing circuit 216 of battery cells 202, 212 may be lower than cells 204-210 due to a voltage drop between cell 202, 212 and sensing circuit 216 associated with the measurement current $I_{TOT}$ and the sensing path resistances.

Consistent with embodiments disclosed herein, the battery sensing circuit 216 and/or an associated control system may perform one or more voltage measurements. Based on these voltages measurements, one or more compensation parameters may be determined accounting for variable resistances along sensing paths coupling the battery cells 202-210 to the battery sensing circuit 216 and/or an associated control system. The compensation parameters may be utilized by the battery sensing circuit 216 and/or an associated control system in performing one or more parameter measurements relating to battery cells 202-210, including voltage measurements of battery cells 202-210. Utilizing the compensation parameters in such measurements may improve the accuracy of the measurements. Systems and methods for determining one or more compensation parameters consistent with embodiments disclosed herein are discussed in detail below in reference to FIGS. 3-4.

Figure 3:
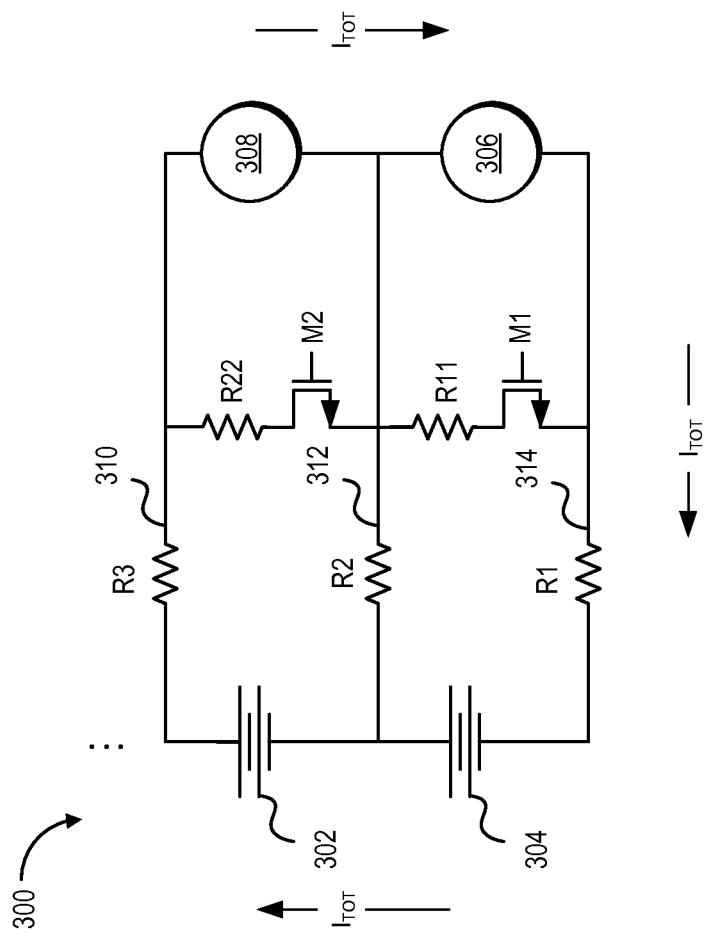
FIG. 3 illustrates a diagram of a circuit configured to determine a compensation parameter for a battery sensing circuit consistent with embodiments disclosed herein.
Figure 4:
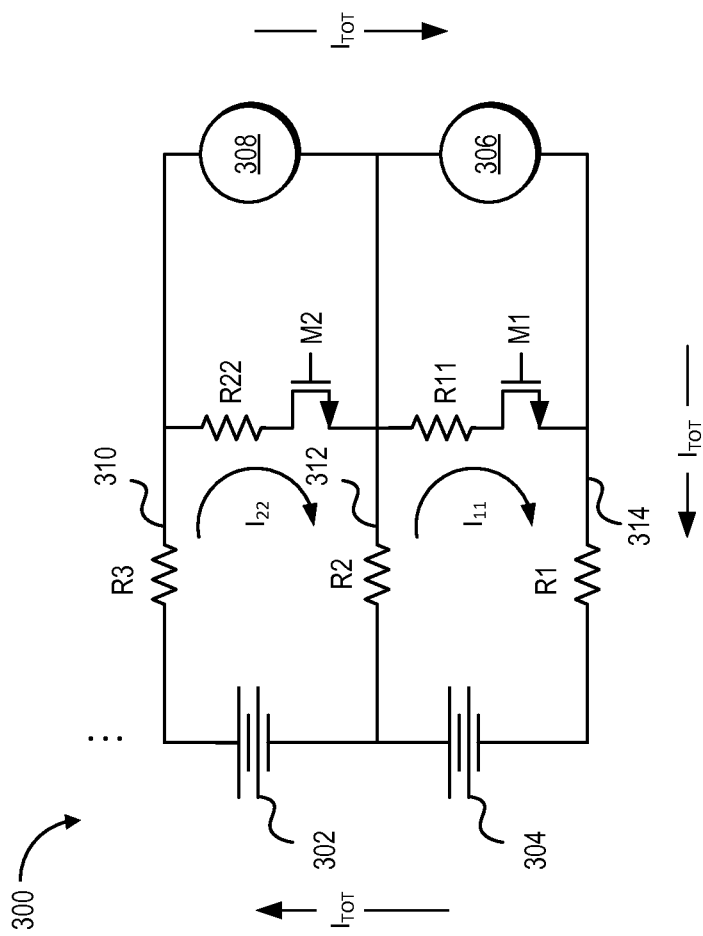
FIG. 4 illustrates another diagram of a circuit configured to determine a compensation parameter for a battery sensing circuit consistent with embodiments disclosed herein.

FIG. 3 and FIG. 4 illustrate a diagram of a circuit 300 configured to determine a compensation parameter for a battery sensing circuit consistent with embodiments disclosed herein. The circuit 300 may include voltage measurement circuits 308, 306 configured to measure voltages across cells 302, 304 respectively via sensing paths 310-314. In certain embodiments, voltage measurement circuits 306, 308 may be associated with a battery sensing circuit and/or an associated control system. Although illustrated as including two battery cells 302, 304 and two voltage measurement circuits 308, 306, embodiments of the systems and methods disclosed herein may be utilized in connection with a battery system having any suitable number of battery cells and a battery sensing circuit having any suitable number of voltage measurement circuits in any suitable configuration.

Sensing paths 310-314 may have associated resistances R1, R2, and R3. These resistances R2, R2, and R3 may be associated with sensing lines, protective fuses, and/or other resistive sources associated with sensing paths 310-314. The circuit 300 may further include a cell balancing system comprising switches M1 and M2 and cell balancing resistors R11 and R22. The switches M1 and M2 and cell balancing resistors R11 and R22 may, based on control signals provided by a battery sensing circuit and/or an associated control system (e.g., control signals switching M1 and M2 between on and off states), facilitate selective energy transfer to, from, and/or between battery cells 302, 304. Switches M1 and M2 may comprise solid-state switches implementing any suitable transitory technology including, without limitation, insulated-gate bipolar transistors ("IGBTs"), Silicon Carbide transistors, low-saturation silicon, wide-band gap, gallium nitride and/or other suitable types of metal-oxide-semiconductor field-effect transistors ("MOSFETs"), bi-polar junction transistors ("BJTs"), junction gate field-effect transistors ("JFETs"), and/or the like.

Current $I_{TOT}$, as illustrated in FIG. 3, may represent a measurement power current associated with a battery sensing circuit, voltage measurement circuits 306,308, and/or an associated control system. In certain embodiments, current $I_{TOT}$ may introduce a voltage drop across one or more sensing paths 310, 314 causing voltage measurements of cells 302, 304 by voltage measurement circuit sensors 306, 308 to be less accurate. For example, path resistance R1 may cause a measured voltage of cell 304 to be less than an actual voltage of cell 304. To mitigate this deleterious effect, one or more voltage measurement compensation parameters accounting for path resistance R1 may be determined.

To determine a compensation parameter, voltage measurement circuit 306 may first measure a voltage of cell 304 with switches M1 and M2 turned off. This measured voltage of cell 304, $V_{1OFF}$, may be expressed according to Equation 1:

$$V_{1OFF} = V_{1CELL} - I_{TOT} R1 \quad \text{(Equation 1)}$$

where $V_{1CELL}$ is the actual voltage of cell 304, R1 is the resistance of sensing path resistance R1, and $I_{TOT}$ is the measurement power current. As expressed in Equation 1, the measured voltage of cell 304, $V_{1OFF}$, may be less than the actual cell voltage $V_{1CELL}$ due to a voltage drop attributable to the resistance of the sensing path R1 and the measurement power current $I_{TOT}$.

Referring to FIG. 4, after measuring $V_{1OFF}$, voltage measurement circuit 306 may then measure a voltage of cell 304 with switches M1 and M2 turned on. This measured voltage of cell 304, $V_{1ON}$, may be expressed according to Equation 2:

$$V_{1ON} = V_{1CELL} - I_{TOT} \cdot R1 - I_{11} \cdot R1 \quad \text{(Equation 2)}$$

where $V_{1CELL}$ is the actual voltage of cell 304, R1 is the resistance of sensing path resistance R1, $I_{TOT}$ is the measurement power current, and $I_{11}$ is a current flowing through a path that includes sensing path resistances R1 and R2, balancing switch M1, and cell balancing resistor R11.

Current $I_{11}$ may be a known and/or measured value that, in certain embodiments may be determined during battery system manufacture or at another suitable time and may be calibrated based on measured voltage $V_{1OFF}$ when the resistance of cell balancing resistors R11 is substantially greater than the sum of resistors R1 and R2 (e.g., R11>>R1+R2). Measurement power current $I_{TOT}$ may also be a known value that, in certain embodiments may be determined during manufacture or at another suitable time and may be calibrated based on temperature, measured voltage $V_{1OFF}$, and/or average cell voltages.

Based on Equations 1 and 2, measured voltages $V_{1ON}$ and $V_{1OFF}$, and given known currents $I_{TOT}$ and $I_{11}$, a value for path resistance R1 may be determined according to Equation 3:

$$R1 = \frac{V_{1OFF} - V_{1ON}}{I_{11}} \quad \text{(Equation 3)}$$

The resistance value of path resistance R1 may be utilized as a compensation parameter for determining an actual voltage of cell 304. For example, solving Equation 1 for actual cell voltage $V_{1CELL}$ results in Equation 4:

$$V_{1CELL} = I_{TOT} \cdot R1 - V_{1OFF} \quad \text{(Equation 4)}$$

Thus, with known current $I_{TOT}$ and measured voltage $V_{1OFF}$, and compensation parameter R1, an accurate voltage of cell 304 may be determined using Equation 4. Actual cell voltage $V_{1CELL}$ may alternatively be determined using Equation 2 in conjunction with known currents $I_{TOT}$ and $I_{11}$, measured voltage $V_{1ON}$, and compensation parameter R1.

Utilizing the aforementioned methods, compensation parameters associated with other sensing paths may be similarly determined (e.g., sensing paths between a battery sensing circuit and/or one or more other battery cells). In certain embodiments, if an actual voltage of a cell measured using the methods disclosed herein is higher than a design voltage of the cell and/or a determined compensation parameter is higher than a predetermined compensation parameter limit, one or more diagnostics and/or protective actions may be implemented as such conditions may indicate an issue with the cell and/or battery system. For example, a diagnostic and/or protective action for an opening sensing line and/or an excessive voltage condition may be implemented under such circumstances. In certain embodiments, precise cell balancing resistors, balancing switch resistances, and voltage measurement circuits may be utilized to improve the accuracy of compensation parameter determinations using the methods disclosed herein.

Figure 5:
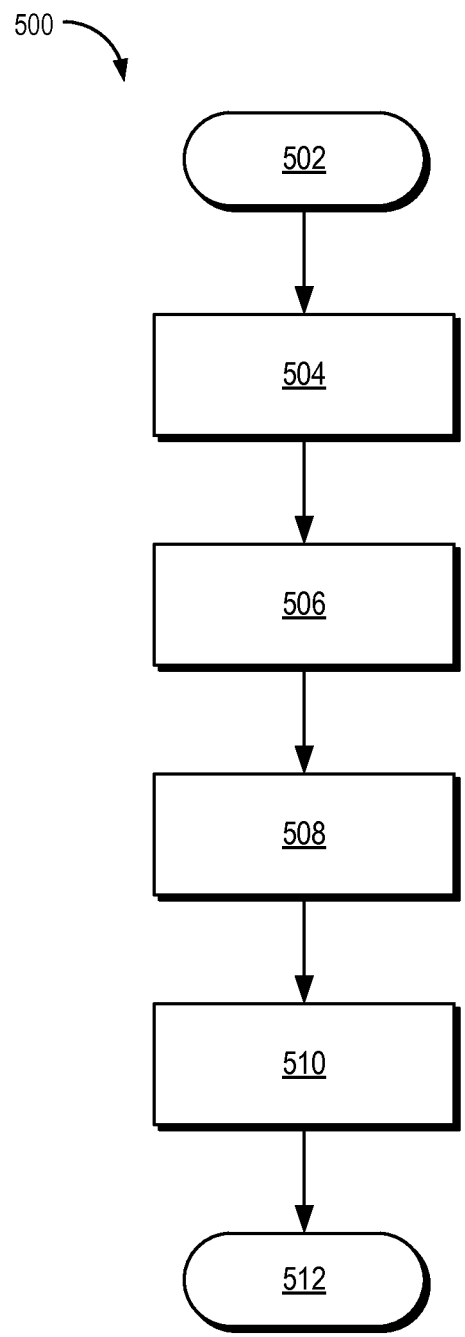
FIG. 5 illustrates a flow chart of an exemplary method for determining a compensation parameter for measuring parameters of a battery system using a battery sensing circuit consistent with embodiments disclosed herein.

FIG. 5 illustrates a flow chart of an exemplary method 500 for determining a compensation parameter for measuring parameters of a battery system consistent with embodiments disclosed herein. The illustrated method 500 may be performed using, at least in part, a vehicle computer system, a battery control system, a battery sensing circuit, and/or any other suitable system.

In some embodiments, certain steps of method 500 may be performed during a manufacturing process of a battery system. For example, a compensation parameter may be determined during a manufacturing process and used in future cell voltage measurements. In further embodiments, the method 500 may be performed once per key cycle of an associated vehicle. In some embodiments, the method 500 may be performed for every battery cell included in a vehicle battery system. For example, the method 500 may be performed for every battery cell included in a vehicle battery system prior to high voltage contactors associated with the battery system closing and/or when current through the battery system is low enough to ensure that cell voltages do not change significantly between the steps of method 500.

The method 500 may initiate at 502. At 504, a first voltage of a first cell in a battery stack may be measured with a first balancing switch associated with the first cell turned off and a second balancing switch associated with a second cell adjacent to the first cell in the battery stack turned off. At 506, a second voltage of the first cell may be measured after turning on the first and second balancing switches.

At 508, a compensation parameter associated with a resistance of a sensing path associated with the first cell may be determined based, at least in part, on the measured first and second voltages. The compensation parameter may further be determined based on a predetermined current associated with a current through the first balancing switch when the first and second balancing switches are turned on. In certain embodiments, the compensation parameter may be calculated using Equation 3, as detailed above.

At 510, an actual voltage of the first cell may be determined based on the compensation parameter and at least one of the first and second voltages. The actual voltage of the first cell may further be determined based on a measurement current of a battery sensing system through a sensing path associated with the first cell that, in certain embodiments, may be a predetermined and/or known current value. In some embodiments, the actual voltage may be calculated using Equation 4, as detailed above. The method 500 may proceed to terminate at 512.

Figure 6:
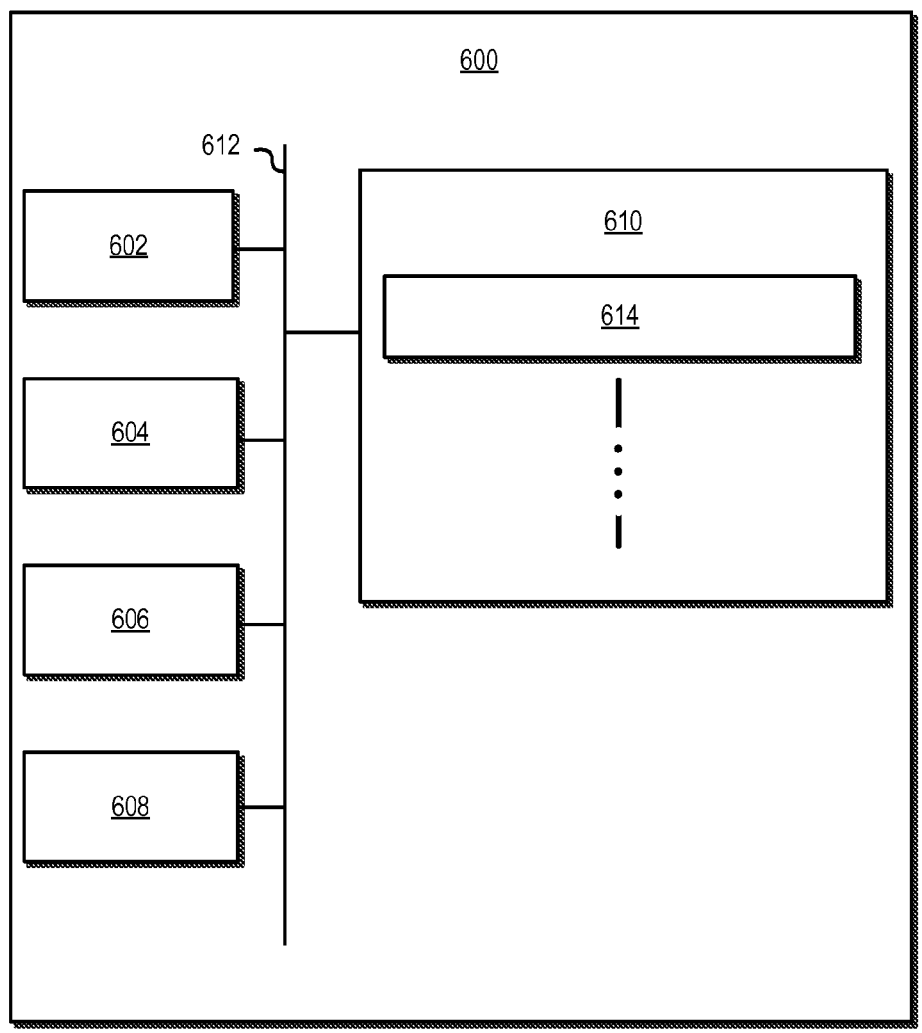
FIG. 6 illustrates a functional block diagram of an exemplary system for implementing certain embodiments of the systems and methods disclosed herein.

FIG. 6 illustrates a block diagram of a computer system 600 that may be utilized in implementing certain embodiments of the systems and methods disclosed herein. In certain embodiments, the computer system 600 may be a personal computer system, a server computer system, an on-board vehicle computer, an electronic control unit, a battery control system, and/or any other type of system suitable for implementing the disclosed systems and methods. In further embodiments, the computer system 600 may be any portable electronic computer system or electronic device including, for example, a notebook computer, a smartphone, and/or a tablet computer.

As illustrated, the computer system 600 may include, among other things, one or more processors 602, random access memory ("RAM") 604, a communications interface 606, a user interface 608, and a non-transitory computer-readable storage medium 610. The processor 602, RAM 604, communications interface 606, user interface 608, and computer-readable storage medium 610 may be communicatively coupled to each other via a common data bus 612. In some embodiments, the various components of the computer system 600 may be implemented using hardware, software, firmware, and/or any combination thereof.

User interface 608 may include any number of devices allowing a user to interact with the computer system 600. For example, user interface 608 may be used to display an interactive interface to a user. The user interface 608 may be a separate interface system communicatively coupled with the computer system 600 or, alternatively, may be an integrated system such as a display interface for a laptop or other similar device. In certain embodiments, the user interface 608 may be produced on a touch screen display. The user interface 608 may also include any number of other input devices including, for example, keyboard, trackball, and/or pointer devices.

The communications interface 606 may be any interface capable of communicating with other computer systems, peripheral devices, and/or other equipment communicatively coupled to computer system 600. For example, the communications interface 606 may allow the computer system 600 to communicate with other computer systems (e.g., computer systems associated with external databases and/or the Internet), allowing for the transfer as well as reception of data from such systems. The communications interface 606 may include, among other things, a modem, an Ethernet card, and/or any other suitable device that enables the computer system 600 to connect to databases and networks, such as LANs, MANs, WANs and the Internet.

Processor 602 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 602 may be configured to execute computer-readable instructions stored on non-transitory computer-readable storage medium 610. Computer-readable storage medium 610 may store other data or information as desired. In some embodiments, the computer-readable instructions may include computer executable functional modules 614. For example, the computer-readable instructions may include one or more functional modules configured to implement all or part of the functionality of the systems and methods described above. Specific functional models that may be stored on computer-readable storage medium 610 may include a module to measure cell voltages, a module to determine a compensation parameter, and a module to determine an actual cell voltage based, at least in part, on the compensation parameter.

The system and methods described herein may be implemented independent of the programming language used to create the computer-readable instructions and/or any operating system operating on the computer system 600. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 600 may be in response to user commands, results of previous processing, or a request made by another processing machine. It will be appreciated that computer system 600 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for measuring an actual voltage of a first cell included in a battery stack, the method comprising:
    measuring a first voltage of the first cell with a first balancing switch associated with the first cell turned off and a second balancing switch associated with a second cell included in the battery stack turned off;
    measuring a second voltage of the first cell with the first and second balancing switches turned on;
    determining a compensation parameter based on the measured first and second voltages; and
    determining the actual voltage of the first cell based on the compensation parameter and at least one of the first and second voltages.

2. The method of claim 1, wherein the first cell and the second cell comprise adjacent cells in the battery stack.

3. The method of claim 1, wherein the compensation parameter is further determined based on a predetermined current associated with a current through the first balancing switch when the first and second balancing switches are turned on.

4. The method of claim 1, wherein the actual voltage of the first cell is further determined based on measurement current of a battery sensing system through a sensing path associated with the first cell.

5. The method of claim 1, wherein the compensation parameter comprises a resistance of a sensing path associated with the first cell.

6. The method of claim 5, wherein the compensation parameter is determined according to:

$$R = \frac{V_{OFF} - V_{ON}}{I_{BAL}}$$

where R comprises the compensation parameter, $V_{OFF}$ comprises the first voltage, $V_{ON}$ comprises the second voltage, and $I_{BAL}$ comprises a predetermined current associated with a current through the first balancing switch with the first and second balancing switches are turned on.

7. The method of claim 6, the actual voltage is determined according to:

$$V_{ACTUAL} = I_{TOT} * R - V_{OFF}$$

where $V_{ACTUAL}$ comprises the actual voltage, $I_{TOT}$ comprises a predetermined current through a sensing path associated with the first cell, R comprises the compensation parameter, and $V_{OFF}$ comprises the first voltage.

8. A system comprising:
a battery stack comprising a first cell;
a first balancing switch coupled to the first cell; and
a battery sensing circuit coupled to the first cell by a first sense path;
wherein the battery sensing circuit is configured to:
measure a first voltage of the first cell with the first balancing switch and a second balancing switch associated with a second cell included in the battery stack turned off;
measure a second voltage of the first cell with the first and second balancing switches turned on;
determine a compensation parameter based on the measured first and second voltages; and
determine the actual voltage of the first cell based on the compensation parameter and at least one of the first and second voltages.

9. The system of claim 8, wherein the first cell and the second cell comprise adjacent cells in the battery stack.

10. The system of claim 8, wherein the battery sensing circuit is further configured to determine the compensation parameter based on a predetermined current associated with a current through the first balancing switch when the first and second balancing switches are turned on.

11. The system of claim 8, wherein battery sensing circuit is further configured to determine the actual voltage of the first cell based on measurement current of a battery sensing system through a sensing path associated with the first cell.

12. The system of claim 8, wherein the compensation parameter comprises a resistance of the first sense path.

13. The system of claim 12, wherein the compensation parameter is determined according to:

$$R = \frac{V_{OFF} - V_{ON}}{I_{BAL}}$$

where R comprises the compensation parameter, $V_{OFF}$ comprises the first voltage, $V_{ON}$ comprises the second voltage, and $I_{BAL}$ comprises a predetermined current associated with a current through the first balancing switch with the first and second balancing switches are turned on.

14. The system of claim 13, the actual voltage is determined according to:

$$V_{ACTUAL} = I_{TOT} * R - V_{OFF}$$

where $V_{ACTUAL}$ comprises the actual voltage, $I_{TOT}$ comprises a predetermined current through a sensing path associated with the first cell, R comprises the compensation parameter, and $V_{OFF}$ comprises the first voltage.

15. A non-transitory computer readable storage medium storing instructions that, when executed by a processor, cause the processor to perform a method comprising:
receiving a first voltage measurement of a first cell included in a battery stack with a first balancing switch associated with the first cell turned off and a second balancing switch associated with a second cell included in the battery stack turned off;
receiving a second voltage measurement of the first cell with the first and second balancing switches turned on;
determining a compensation parameter based on the first and second voltage measurements; and
determining the actual voltage of the first cell based on the compensation parameter and at least one of the first and second voltage measurements.

16. The non-transitory computer-readable storage medium of claim 15, wherein the first cell and the second cell comprise adjacent cells in the battery stack.

17. The non-transitory computer-readable storage medium of claim 15, wherein the compensation parameter is further determined based on a predetermined current associated with a current through the first balancing switch when the first and second balancing switches are turned on.

18. The non-transitory computer-readable storage medium of claim 15, wherein the actual voltage of the first cell is further determined based on measurement current of a battery sensing system through a sensing path associated with the first cell.

19. The non-transitory computer-readable storage medium of claim 15, wherein the compensation parameter comprises a resistance of a sensing path associated with the first cell.

* * * * *